(12) United States Patent
Horiuchi et al.

(10) Patent No.: US 6,236,112 B1
(45) Date of Patent: May 22, 2001

(54) SEMICONDUCTOR DEVICE, CONNECTING SUBSTRATE THEREFOR, AND PROCESS OF MANUFACTURING CONNECTING SUBSTRATE

(75) Inventors: Michio Horiuchi; Takuya Kazama, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/434,113

(22) Filed: Nov. 5, 1999

(30) Foreign Application Priority Data

Nov. 5, 1998 (JP) .................................................. 10-314723

(51) Int. Cl.[7] .................................................. H01L 21/44
(52) U.S. Cl. ............................ 257/734; 257/737; 257/738
(58) Field of Search ............................ 438/612; 257/734, 257/737, 738

(56) References Cited

U.S. PATENT DOCUMENTS 5,258,648 * 11/1993 Lin .
6,002,180 * 12/1999 Akrom et al. .

FOREIGN PATENT DOCUMENTS 62-293730 12/1987 (JP) .
4-82244 3/1992 (JP) .
4-154136 5/1992 (JP) .

* cited by examiner

*Primary Examiner*—Kevin M. Picardat
*Assistant Examiner*—D. M. Collins
(74) *Attorney, Agent, or Firm*—Staas & Halsey LLP

(57) ABSTRACT

A semiconductor device having a semiconductor element and a connecting substrate, wherein the connecting substrate includes a flat sheet-like insulation member, having first and second surfaces. The first surface is provided with solder bumps projecting at locations corresponding to locations of electrodes on an electrode/terminal-formed face of the semiconductor element, or terminals formed at ends of patterned wirings formed by rerouting a conductive material on the electrode/terminal-formed fact. The second surface is provided with external connection terminals having a larger diameter than the solder bumps on the first surface and being electrically connected with the solder bumps through a via piercing the insulation member in the direction of its thickness. The semiconductor element is mounted on the connecting substrate by bonding the electrodes or the terminals on the electrode/terminal-formed face of the semiconductor element to the solder bumps.

13 Claims, 8 Drawing Sheets

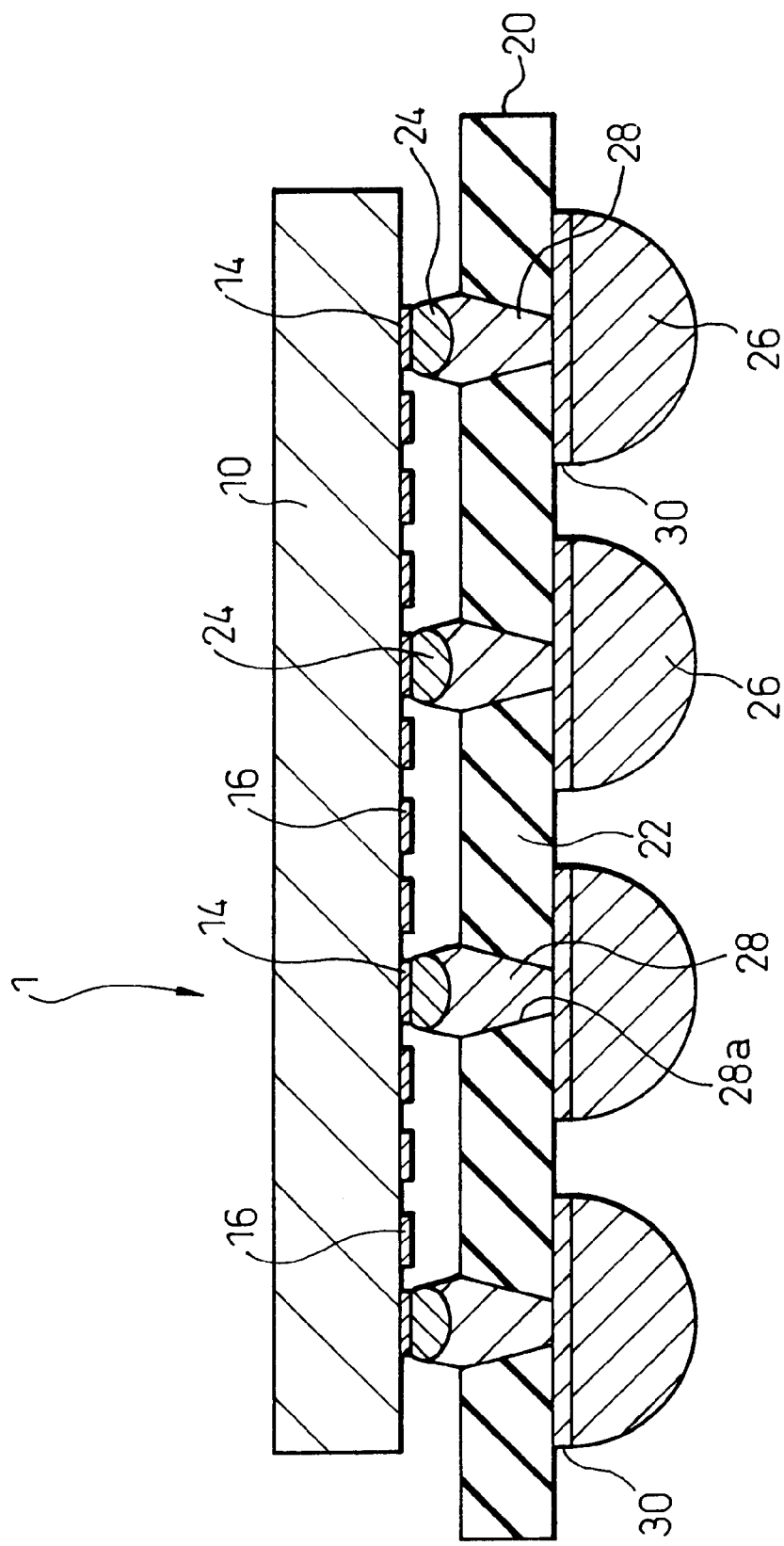

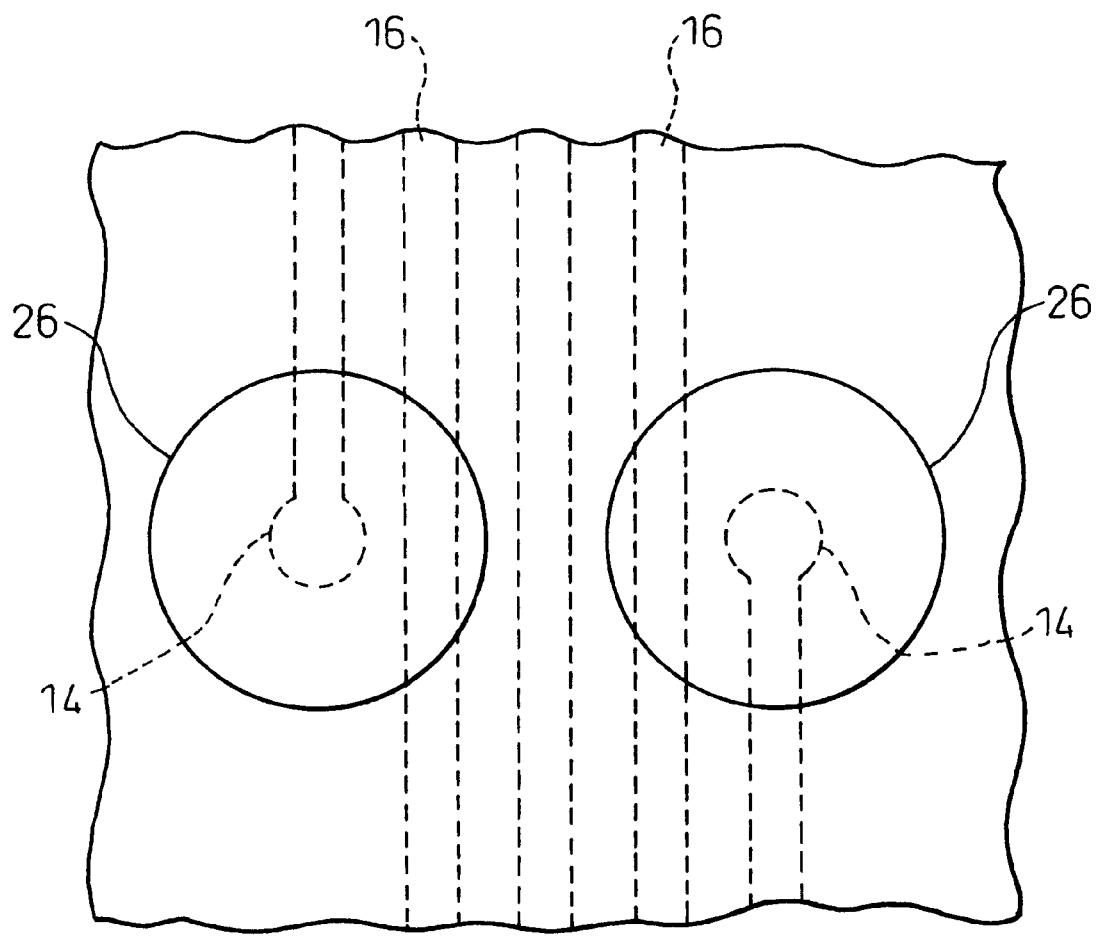

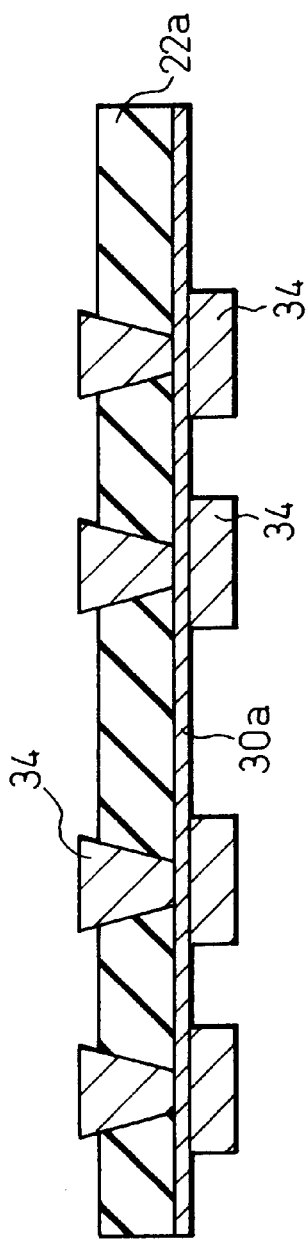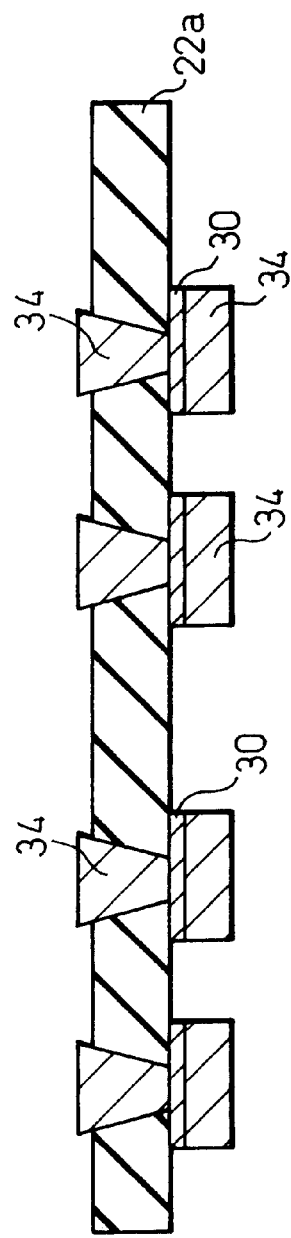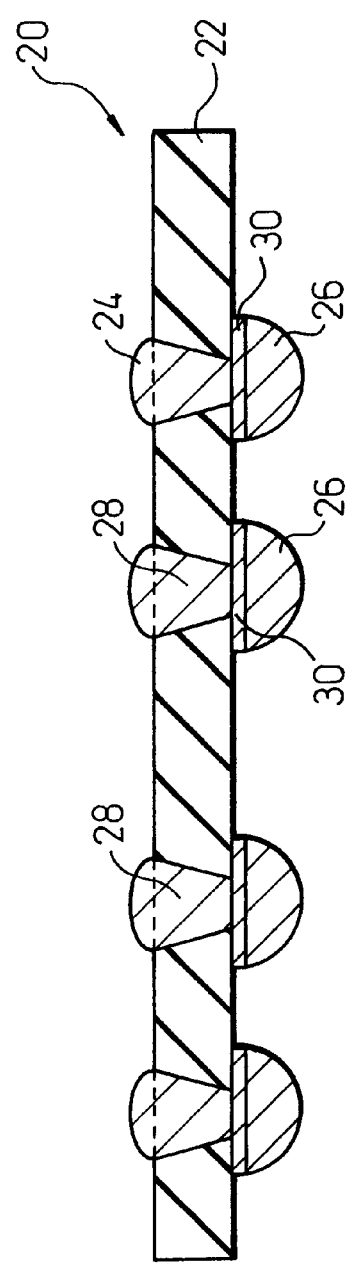

SEMICONDUCTOR DEVICE, CONNECTING SUBSTRATE THEREFOR, AND PROCESS OF MANUFACTURING CONNECTING SUBSTRATE

BACKGROUND OF THE INVENTION

1. Field of the Invention

The invention relates to a semiconductor device fabricated in a size which is approximately the same as that of a semiconductor element, and also relates to a connecting substrate used in such a semiconductor device and a method of manufacturing the connecting device.

2. Description of the Related Art

A chip sized package (CSP) is a semiconductor device fabricated in a size which is approximately the same as that of a semiconductor element, and is provided on its mounting face with external connection terminals such as solder bumps so as to be capable of being mounted on a mounting substrate by use of the external connection terminals. In general, external connection terminals are arranged, in an array, on a mounting face of a chip sized package to cope with multi-pin arrangement required of advanced semiconductor devices.

FIG. 7 illustrates an example in which terminals 14 to be subsequently connected with external connection terminals are arranged on a mounting face of a semiconductor element 10. In the drawing, electrodes formed on the mounting face of the semiconductor element 10 are designated by reference numeral 12, and patterned wirings for the connection between the electrodes 12 and the terminals 14 are designated by 16.

The terminals 14 are arranged in an array on the face, on which electrode terminals are formed, of the semiconductor element 10 by, for example, a method in which, as shown in FIG. 8, the patterned wirings 16 are rerouted on the surface of a passivation film 8 of the semiconductor element 10, and the terminal 14 is provided at an end of the patterned wiring 16, or a method in which a wiring patterned film having terminals provided in a given arrangement is bonded to the electrode/terminal-formed face of the semiconductor element through a buffer layer. The patterned wirings 16 are located on an insulation film formed on the passivation film 8, although the insulation film is not shown in FIG. 8.

The electrode terminal 14 to be connected with the external connection terminal 26 (FIG. 8) is required to have a diameter of an order of 300 micrometers. Accordingly, if the terminals 14 are positioned directly on electrode/terminal-formed face of the semiconductor element 10, the distance between adjacent terminals 14 is narrower, and the space where the patterned wirings 16 are arranged is restricted. Arranging the electrodes 12 at a higher density to increase the number of electrodes 12 results in an increase in the number of patterned wirings 16 connecting the electrodes 12 to the terminals 14, which makes it more difficult to obtain the space where the patterned wirings 16 are rerouted.

Although it is envisaged that the patterned wirings 16 are formed in multiple layers when the patterned wirings 16 cannot be rerouted within the electrode/terminal-formed face of the semiconductor element 10, forming the patterned wirings 16 in multiple layers raises problems with respect to a complicated manufacturing process and reliability of products.

Also, when the buffer layer and wiring patterned film were used as interposers to electrically connect the electrodes 12 of the semiconductor element 10 to the terminals provided on the wiring patterned film, there were problems of complexities of a process for the manufacture of the wiring patterned film and operations for the manufacture of semiconductor devices.

SUMMARY OF THE INVENTION

The invention aims to provide a connecting substrate and a process of the manufacture thereof, the connecting substrate having a simpler structure compared with conventional interposers to thereby make it possible to easily and less expensively manufacture semiconductor devices fabricated in a size which is approximately the same as that of a semiconductor element, and also provide a semiconductor device produced using the connecting substrate.

Thus, the invention provides a semiconductor device having a semiconductor element and a connecting substrate, wherein the connecting substrate comprises a flat sheet-like insulation member having first and second surfaces, the first surface being provided with solder bumps projecting from the first surface at the locations corresponding to the locations of electrodes on an electrode/terminal-formed face of the semiconductor element or terminals formed at ends of patterned wirings formed by rerouting a conductive material on the electrode/terminal-formed face, the second surface being provided with external connection terminals which have a larger diameter than that of the solder bump on the first surface and are electrically connected with the solder bumps through a via piercing the insulation member in the direction of its thickness, and wherein the semiconductor element is mounted on the connecting substrate by bonding the electrodes or the terminals on the electrode/terminal-formed face of the semiconductor element to the solder bumps.

Preferably, an underfiller material is filled in the gap between the electrode/terminal-formed face of the semiconductor element and the insulation member.

Preferably, the insulation member is made of a material having Young's moduli of not greater than 500 MPa near room temperature and not greater than 50 MPa near 150° C.

Preferably, the via is formed by filling a hole penetrating the insulation member with solder.

Preferably, the via is formed by filling most of a hole penetrating the insulation member with copper material.

The invention also provides a connecting substrate used to produce a semiconductor device, which comprises a flat sheet-like insulation member having first and second surfaces, the first surface being provided with solder bumps projecting from the first surface at the locations corresponding to the locations of electrodes on an electrode/terminal-formed face of the semiconductor element or terminals formed at ends of patterned wirings formed by rerouting a conductive material on the electrode/terminal-formed face, the second surface being provided with external connection terminals which have a larger diameter than that of the solder bump on the first surface and are electrically connected with the solder bumps through a via piercing the insulation member in the direction of its thickness.

Preferably, the insulation member is made of a material having Young's moduli of not greater than 500 MPa near room temperature and not greater than 50 MPa near 150° C.

Preferably, the via is formed by filling a hole penetrating the insulation member with solder.

Preferably, the via is formed by filling most of a hole penetrating the insulation member with copper material.

The invention further provides a process of the manufacture of a connecting substrate used to produce a semiconductor device, which comprises:

preparing a flat sheet-like insulation member having a first surface covered with a copper foil and a second surface with no cover;

piercing holes in the insulation member, at the locations corresponding to the locations of electrodes on an electrode/terminal-formed face of a semiconductor element or terminals formed at ends of patterned wirings formed by rerouting a conductive material on the electrode/terminal-formed face, the holes piercing through the insulation member in the direction of its thickness to expose portions of the back side of the foil;

forming a resist pattern on the surface side of the copper foil, the resist pattern having holes having a larger diameter than that of the hole piercing the insulation member to expose portions of the surface side of the copper foil in a concentrical relationship with the holes piercing the insulation member;

plating the exposed portions of both surface and back sides of the foil with solder using the foil as an electrical power supply layer for the plating to thereby fill the holes piercing the insulation member and the holes in the resist pattern with the solder;

removing the resist pattern to thereby expose the copper foil and leave the plated solder pattern;

etching the exposed copper foil using the plated solder pattern as a mask; and reflowing the solder to thereby simultaneously form, on the first surface of the insulation member, external connection terminals of the solder in the form of bump, and, on the second surface a the insulation member, solder bumps integrated with the solder filled in the holes piercing the insulation member.

Preferably, prior to the plating with solder, electrolytic plating of the back side of the foil with copper material to partially, preferably mostly, fill the holes piercing the insulation member, and subsequent plating of the exposed surface side of the copper foil and the surface of the copper material filled inside the holes piercing the insulation member with the solder, is carried out.

The invention further provides a process of the manufacture of a connecting substrate used to produce a semiconductor device, which comprises:

preparing a flat sheet-like insulation member having a first surface covered with a copper foil and a second surface with no cover;

piercing holes in the insulation member, at the locations corresponding to the locations of electrodes on an electrode/terminal-formed face of a semiconductor element or terminals formed at ends of patterned wirings formed by rerouting a conductive material on the electrode/terminal-formed face, the holes piercing through the insulation member in the direction of its thickness to expose portions of the back side of the foil;

coating the surface side of the foil with a resist film;

plating the exposed portions of the back side of the foil with solder using the foil as an electrical power supply layer for the plating to thereby fill the holes with the solder;

forming a resist pattern on the surface side of the copper foil so as to expose portions of the surface side of the copper foil, the exposed portions being in a concentrical relationship with the holes piercing the insulation member and having a larger diameter than that of the hole piercing the insulation member;

etching the exposed portions of the surface side of the copper foil using the resist pattern as a mask to thereby form lands; and bonding external connection terminals to the lands.

Preferably, the holes piercing the insulation member, with or without the plated copper, are filled with the solder so that the solder projects from the second surface of the insulation member.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein:

FIG. 1 is a cross sectional view of an embodiment of the semiconductor device of the invention;

FIG. 2 is a partial plan view of the semiconductor device of FIG. 1;

FIGS. 3A to 3G illustrate a process of the manufacture of the semiconductor device of the invention;

DETAILED DESCRIPTION OF THE INVENTION

Figure 3A:
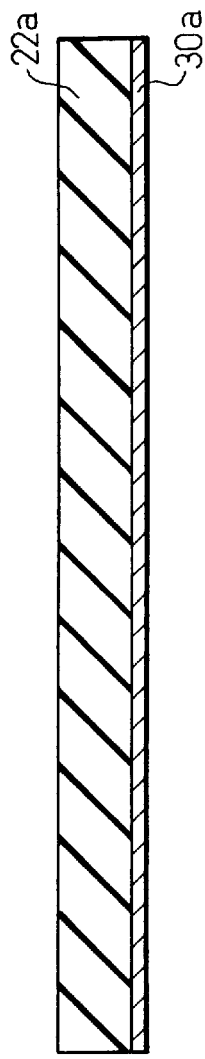

FIG. 1 shows a cross section of an embodiment of the semiconductor device of the invention. The semiconductor device 1 of this embodiment has a structure in which electrodes or terminals 14 on an electrode/terminal-formed face of a semiconductor element 10, the terminals 14 being formed by rerouting a conductive material on the electrode/terminal-formed face of the semiconductor element 10, are bonded to solder bumps 24 provided at one side of insulation member 22 constituting a body of connecting substrate 20, the insulation member 22 carrying external connection terminals 26 made of solder in the form of a bump at the other side of the insulation member 22.

The insulation member 22 is provided with holes 28a piercing the insulation member in the direction of its thickness, and vias 28 are formed by filling the holes 28a with solder. One end of the via 28 is connected to the solder bump 24, and the other end is connected to an external connection terminal 26 through a copper land 30. The solder bump 24 and the external connection terminal 26 are concentrically or substantially concentrically formed at the respective sides of the insulation member, and are electrically connected with each other through the via 28.

The semiconductor device of this embodiment is characterized in that the solder bump 24 has a diameter which is equivalent or approximately equivalent to a diameter of the electrode or terminal 14 formed on the electrode/terminal-formed face of the semiconductor element 10, and is smaller than a diameter of the external connection terminal 26. Bumps and the like used as external connection terminals have, in general, a diameter of the order of 300 micrometers, because it is required for the external connection terminal to have a relatively larger size to secure a sufficient bonding strength for mounting a device to a mounting substrate, and the external connection terminal 26 in the present embodiment is also formed to have a diameter of the order of 300 micrometers, whereas the solder bump 24 bonded to the electrode or terminal 14 of the semiconductor element 10 has a diameter of about 150 micrometers.

The use of the bumps 24 having such a smaller diameter for the connection with terminals 14 of the semiconductor element 10 makes it easy to arrange patterned wirings 16 formed by rerouting a conductive material on the electrode/terminal-formed face, and enables the terminals 14 to be efficiently arranged in a plane of the electrode/terminal-formed face of the semiconductor element 10. Although FIG. 1 shows the patterned wirings 16 located on the surface of the semiconductor element 10, the patterned wirings 16 are actually located on an insulation film made of, for example, polyimide, formed on a passivation film provided on the surface of the semiconductor element 10, as known to a person with ordinary skill in the art. The patterned wirings 16 may be covered by a solder resist (not shown), except for a portion for the terminal 14.

When terminals having a larger diameter of, for example, 300 micrometers are formed on the electrode/terminal-formed face of the semiconductor element 10, it is required to allot a larger space to the terminals, and a space to be allotted to the patterned wirings 16 rerouted on the electrode/terminal-formed face to connect the terminals to the electrode of the semiconductor element 10 is smaller. In contrast, when the solder bumps 24 to be bonded to the terminals 14 have a smaller diameter, the terminals 14 can then also have a smaller diameter, and a space to be allotted to the patterned wirings 16 rerouted on the electrode/terminal-formed face can be larger. Thus, in the case where electrodes are located at a higher density on the electrode/terminal-formed face, it is very useful to form electrodes or terminals therefor having a smaller size on the electrode/terminal-formed face, which are connected with larger bumps or external connection terminals formed in a plane different from the plane of the electrode/terminal-formed face.

For example, referring to FIG. 2 showing a partial plan view of the semiconductor device 1 of FIG. 1, two sets of terminals 14 of a smaller diameter located on an electrode/terminal-formed face of an semiconductor element and external connection terminals 26 of a larger diameter located on a connecting substrate, and several patterned wirings 16 on the electrode/terminal-formed face are illustrated. The wirings 16 are formed in a ratio of line (wiring) and space of 1:1, and each of terminals 14 is connected with one of the patterned wires 16, the remaining wirings 16 being connected with other terminals (not shown). Because of the larger size of the external connection terminals 26, no or little wiring can be placed on the electrode/terminal-formed face of the semiconductor element if the external connection terminals 26 are located on the electrode/terminal-formed face.

The insulation member 22 serves to lessen a thermal stress caused by a difference between coefficients of thermal expansion of the semiconductor element 10 and a mounting substrate (not shown) when the semiconductor device 1 is mounted on the substrate through the external connection terminals 26. For this reason, a material having a smaller elasticity modulus to show required buffer properties is used for the insulation member 22. As a material of smaller elasticity modulus, for example, a heat-resistant rubber based on a silicone or fluorinated resin, an epoxy or other resin containing a dispersed low elasticity modulus material such as NBR, a polyolefin, or polyimide can be used. In addition, a glass fiber-filled resin, such as a glass fiber-filled epoxy, bismaleimide triazine (BT), or polyphenylene ether (PPE), may be used for the insulation member. These low elasticity modulus materials have Young's moduli of not greater than 500 MPa near room temperature and on the level of 1 to 50 MPa near 150° C.

The effect of lessening the thermal stress in the mounted semiconductor device is based on the fact that the vias 28 can be displaced when the thermal stress occurs to lessen and/or absorb the thermal stress. Thus, to make it easy to lessen the thermal stress, it is preferred that the vias 28 have a larger length and a smaller diameter.

It is also useful for the lessening of thermal stress that a conventional underfiller material (not shown for simplicity) is filled in the gap formed between the electrode/terminal-formed face of the semiconductor element 10 and the insulation member 22, and joints or connections between the solder bump 24 and the terminal 14 are fixed, to thereby prevent a stress from being concentrated on the joints or connections between the solder bump 24 and the terminal 14.

Referring to FIG. 3, a process useful for the manufacture of the connecting substrate 20 used in the semiconductor device 1 set forth above will now be described.

To form the insulation member 22 of the connecting substrate 20, a layer of a silicone rubber 22a is formed on one side of a copper foil 30a (FIG. 3A). In the example herein, a silicone rubber layer 22a of 500 micrometers thick was formed on a surface of a copper foil 30a of 35 micrometers thick. The silicone rubber layer 22a can be formed by coating the copper foil with a liquid silicone rubber. A commercially available product in which a film showing a necessary stress lessening effect, such as a film of silicone rubber, is coated on one side with a conductive layer of copper foil or the like, may be used to form the insulation member 22.

In place of the silicone rubber layer 22a, a layer of another material displaying a necessary stress lessening effect may be used. When the insulation member 22 is allowed to have a smaller stress lessening effect, a material which does not have a particularly large stress lessening effect may be used for the insulation member 22. Connecting the solder bump 24 having a smaller diameter to the external connection terminal 26 having a larger diameter through the via 28, as in the embodiment referred to above, means changing the size of connection to a substrate on which the semiconductor device 1 is to be mounted so that the connection has a larger size sufficient to withstand the stress.

The copper foil 30a is provided to form the external connection terminals 26 by use of a rising plating technique in which a plating material is raised or deposited on an electrically conductive material at the bottom of a hole. Accordingly, the copper foil 30a (an electrically conductive material) may be replaced with a film or layer of another conductive material.

Figure 3B:
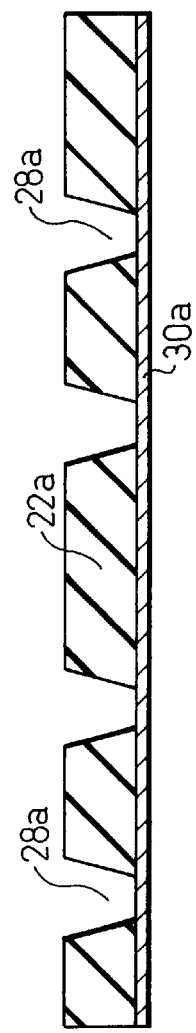

Holes 28a piercing the silicone rubber layer 22a are then made at locations corresponding to the locations of electrodes formed on an electrode/terminal-formed face of the semiconductor element (FIG. 1) or terminals 14 formed by rerouting a conductive material on the electrode/terminal-formed face (FIG. 3B). The holes 28a can be made by irradiation Of $CO_2$ laser light onto the silicone rubber layer 22a. In the example herein, the holes 28 having an opening diameter of about 150 micrometers were made at a pitch of 500 micrometers to expose the copper foil 30a at their inside bottom. Using such a laser light etching, holes 28a having a larger opening diameter and a smaller bottom diameter and having a trapezoidal section are made. Holes 28a may be made by another technique such as ion milling.

Figure 3C:
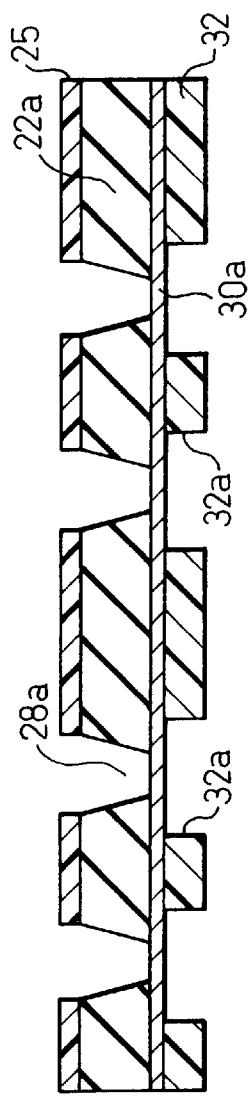

A dry film, as a resist for plating, is then laminated onto the surface of the copper foil 30a, and is subjected to exposure and subsequent development, to form a resist pattern 32 for the plating (FIG. 3C). The resist pattern 32 has holes 32a exposing parts of the surface of the copper foil 30a, at the concentrical locations with the holes 28a provided in the silicone rubber layer 22a, the holes 32a being circular and having a larger opening diameter than that of the hole 28a. In the example herein, the holes 32a had an opening diameter of 300 micrometers. Since the resist pattern 32 is to form the external connection terminals 26 in the form of bump, it is required to secure a thickness of the order of 150 micrometers. It is also possible to form the resist pattern 32 by coating a liquid resist material in place of use of a dry resist. Also, protective plating, such as nickel-gold plating, may be provided after the formation of resist pattern 32.

Figure 3D:
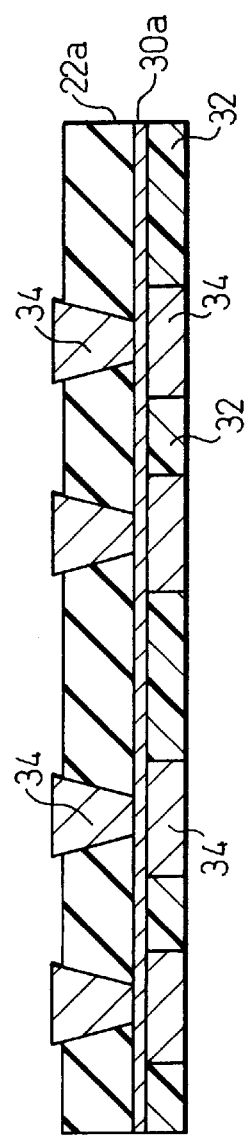

The copper foil 30a is then plated with a tin-lead eutectic solder using the foil 30 as an electrical power supply layer, to thereby raise or deposit the plating material in the holes 28a piercing the silicone rubber layer 22a, and simultaneously raise or deposit the plating material in the holes 32a of the resist pattern 32 (FIG. 3D). In the step of raising the tin-lead eutectic solder material using the copper foil 30a as the electrical power supply layer, the solder material 34 is filled in the holes 28a piercing the silicone rubber layer 22a, and is further raised so as to slightly project from the surface of the silicone rubber layer 22a, as illustrated in FIG. 3D.

To certainly project a solder material 34 from the surface of the silicone rubber layer 22a, a resist film having a thickness adapted to a quantity of the solder material to be projected may be applied to the surface of the silicone rubber layer 22a. Specifically, a resist film is adhered to the surface of the patterned silicone rubber layer 22a and is patterned to create holes at the locations corresponding to the locations of the holes 28a of the patterned silicone rubber layer 22a to provide a patterned resist film 25 (FIG. 3C), after which plating is carried out to fill a plating material up to the holes of the resist film 25, and subsequently, the resist film 25 is peeled and removed to leave the plating material 34 projected from the surface of the silicone rubber layer 22a. The plated solder material 34 slightly projecting from the surface of the silicone rubber layer 22a will allow the material 34 to transform into the solder bumps 24 projecting from the surface of the silicone rubber layer 22a.

On the other hand, the plating material 34 is raised or deposited in the holes 32a of the resist pattern 32 to the extent that the material practically fills the holes 32a of the resist pattern 32.

The resist pattern 32 used for the plating is then removed from the surface of the copper foil 30a (FIG. 3E). By the removal of the resist pattern 32, an array of projections of the plated solder material 34 having a circular cross section is left on the surface of the copper foil 30a.

The copper foil 30a is then etched using an etchant selectively etching copper and using the array of projections of the solder material 34 as a mask (FIG. 3F).

The solder is then fused and reflowed to form the solder bumps 24 and the external connection terminals 26 in the form of bump, as shown in FIG. 3G. The holes 28a piercing the silicone rubber layer 22a are transformed into the vias 28 filled with the solder material. Consequently, the connecting substrate 20 is obtained, which has the vias 28 piercing the insulation member 22, and in which the solder bumps 24 communicating with the vias 28 are formed on one side of the insulation member 22, and the external connection terminals 26 electrically connected to the vias 28 are formed on the other side.

Although the connecting substrate 20 obtained by the process described above has the vias 28, the solder bumps 24, and the external connection terminals 26 which are all formed by the plated solder material 34, the vias 28 can be also formed by electrolytic copper in place of use of the plated solder material 34.

This embodiment of the invention will now be described with reference to FIG. 4. After the formation of holes 28a piercing the silicone rubber layer 22a (FIG. 3B), the surface of the copper foil 30a is coated with a resist film 36 for plating, as shown in FIG. 4A. Electrolytic plating is then carried out using the copper foil 30a as an electrical power supply layer, to raise electrolytic copper material 38 inside the holes 28a to the extent that the holes 28a are partially, preferably almost, filled with it (FIG. 4B).

Figures 4A, 4B, 4C, 4D:
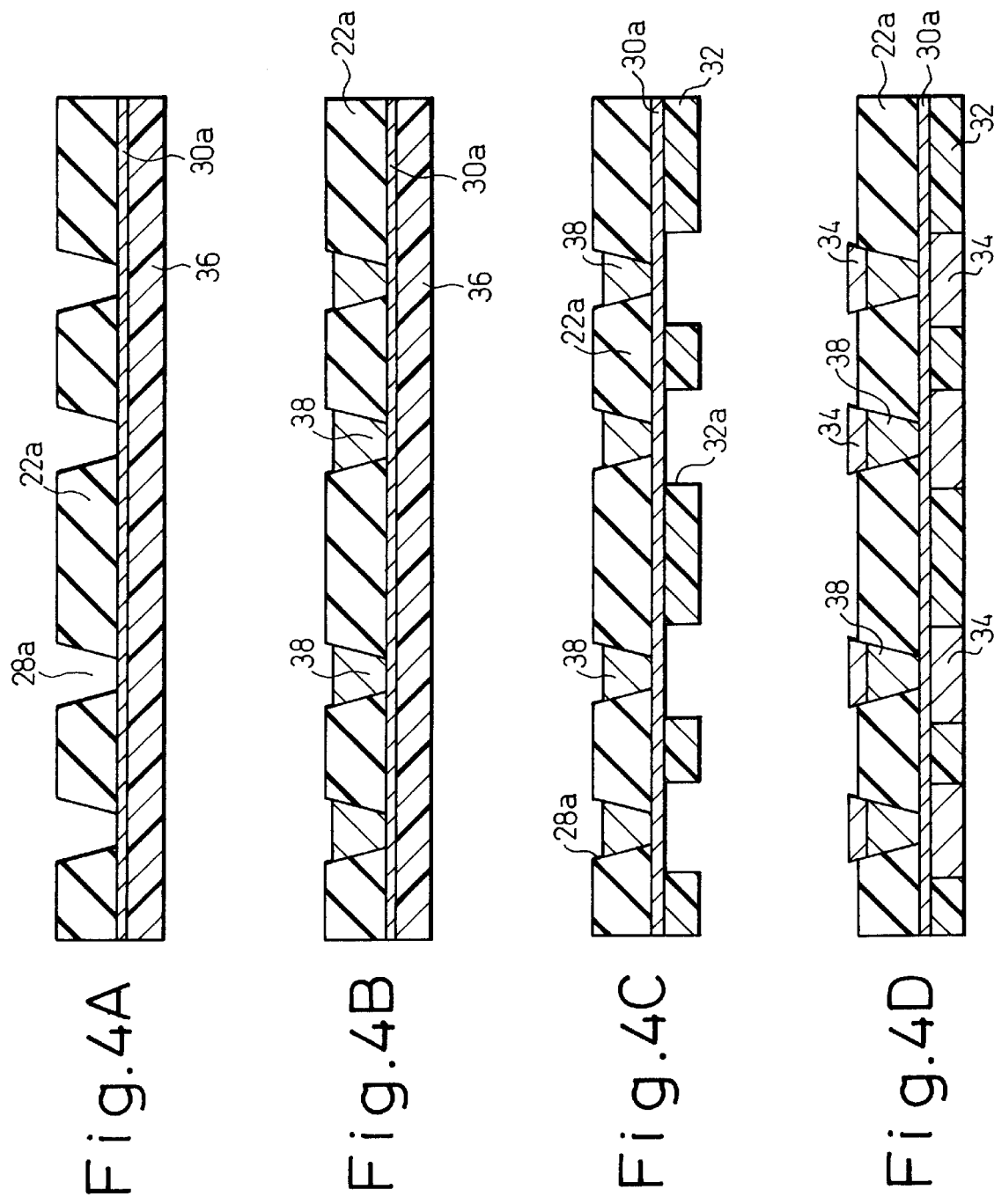
FIGS. 4A to 4D illustrate an alternative process of the manufacture of the semiconductor device of the invention.

The resist film 36 is then removed, and a resist pattern 32 which is the same as that used in the former embodiment described with reference to FIG. 3 is formed (FIG. 4C). The copper foil 30a and the raised copper material 38 are then plated with a tin-lead eutectic solder using the copper foil 30a as an electrical power supply layer, to thereby raise the plated solder material 34 in the holes 32a of the resist pattern 32, and simultaneously raise the plated solder material 34 on the surface of the copper material 38 inside the holes 28a piercing the silicone rubber layer 22a (FIG. 4D).

The subsequent steps of removing the resist pattern 32, etching the copper foil 30a, reflowing the solder to form the solder bumps 24 and the external connection terminals 26 in the form of bumps, are the same as those in the former embodiment described with reference to FIG. 3.

In this way, the connecting substrate 20 in which the vias 28 are formed of, for the most part, electrolytic copper 38 is obtained. This type of connecting substrate has an advantage of having better electrical properties as a whole because of the use of copper material in the vias 28.

FIG. 5 illustrates a further process for the manufacture of the connecting substrate 20. A 100 micrometer thick silicone rubber layer 22a provided on one side with a copper foil 30a is irradiated by laser light to be provided with holes 28a piercing the silicone rubber layer 22a, as shown in FIG. 5A. Solder plating is then carried out using the copper foil 30a as an electrical power supply layer, to thereby raise a plated solder material 34 in the holes 28a, as shown in FIG. 5B. In this case, the outer side of the copper foil 30a is coated with a resist film 36 so that only copper foil within the holes 28a will be plated.

Figure 5A:
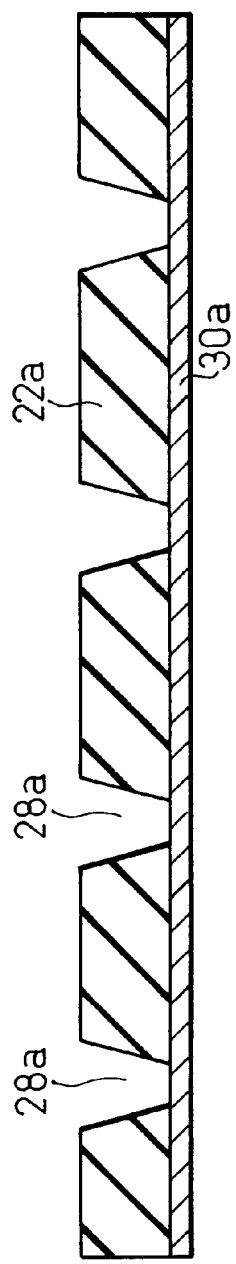
FIGS. 5A to 5D illustrate a further process of the manufacture of the semiconductor device of the invention.
Figure 5B:
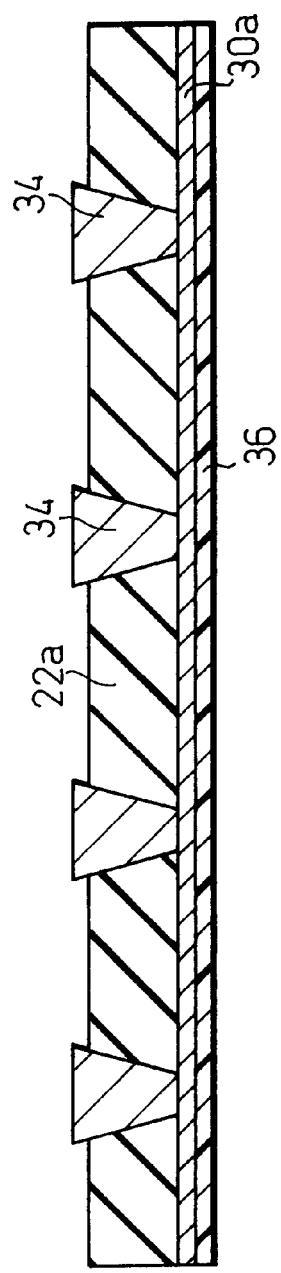
Figure 5C:
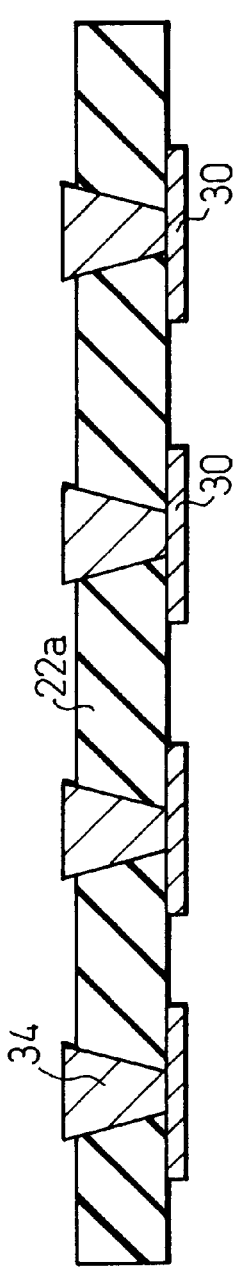

Subsequently, the resist film 36 is patterned, or a fresh resist film alternative to the film 36 is formed and patterned, to thereby form a resist pattern. Using the resist pattern as a mask, the copper foil 30a is etched to thereby form lands 30 on which external connection terminals are to be subsequently formed, as shown in FIG. 5C.

Figure 5D:
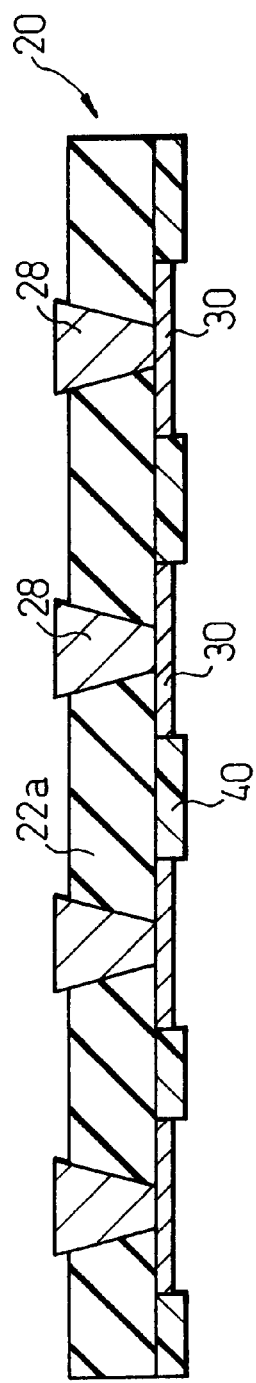

The face of the silicone rubber layer 22a bearing the lands 30 is then coated with a solder resist 40 in such a manner that the lands 30 are left uncoated, as shown in FIG. 5D.

Alternatively, the peripheral region of the land 40 may be coated with the solder resist 40 to leave only the central region of the land 40 uncoated. A connecting substrate is obtained by subsequently placing a solder ball on the land 40 and reflowing the solder balls to form external connection terminals.

Figure 6:
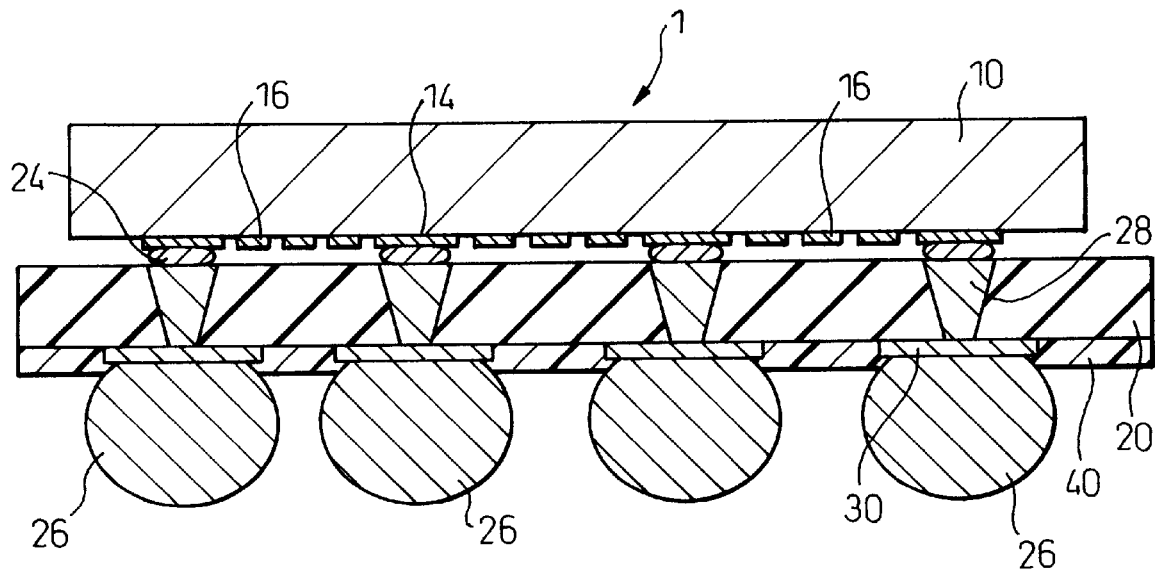
FIG. 6 shows a further embodiment of the semiconductor device of the invention.
Figure 7:
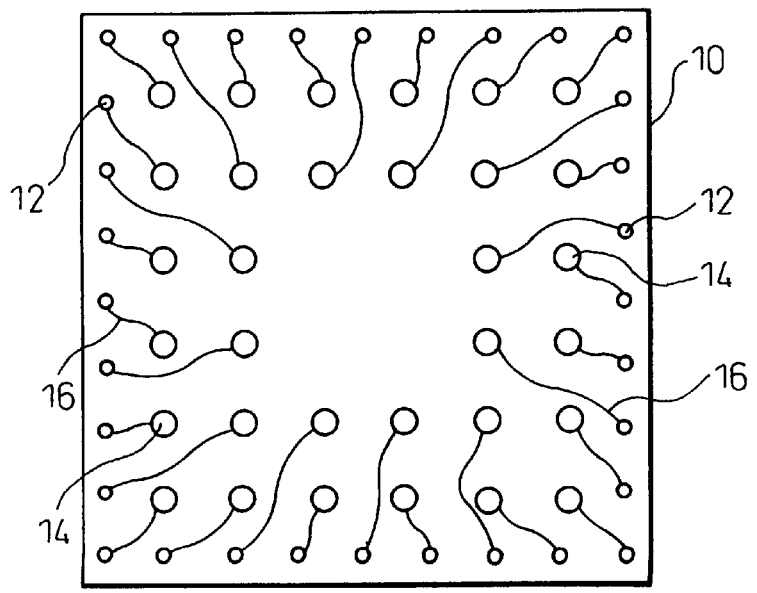
FIG. 7 illustrates an arrangement of electrodes and terminals therefor on a surface of an semiconductor element.
Figure 8:
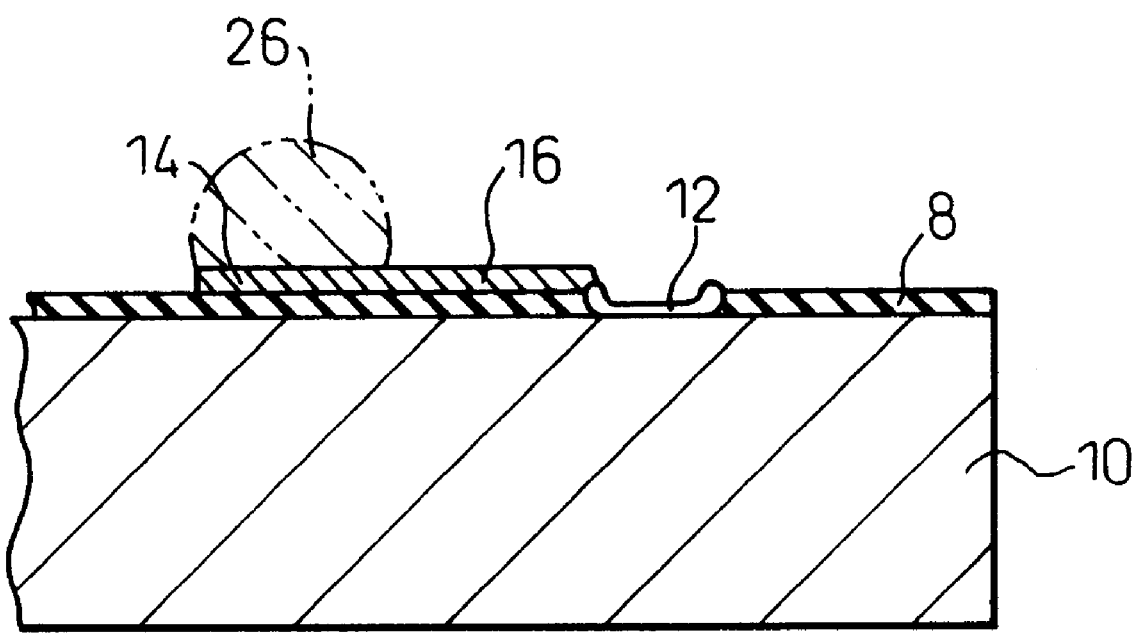
FIG. 8 illustrates a patterned wiring formed on a surface of a semiconductor device.

FIG. 6 shows a connecting substrate 20 having external connection terminals 26 formed from solder balls bonded to lands 30. In this drawing, a semiconductor element 10 is mounted on the connecting substrate 20 through solder bumps 24 to provide a semiconductor device 1.

As illustrated above, the connecting substrate 20 of the invention comprises vias 28 straightly piercing the insulation member 22 of the substrate 20 in the direction of its thickness, to thereby allow the electrodes or terminals 14 on the semiconductor element 10 and the external connection terminals 26 on the substrate 20 to be concentrically connected by the via 28, and also allow a substantially larger number of patterned wirings to be formed on the semiconductor element 10. Thus, the connecting substrate 20 of the invention is particularly advantageous for a semiconductor device having an approximately the same size as that of a semiconductor element, which is also called a chip sized package (CSP).

When a semiconductor device is produced using the connecting substrate 20 of the invention, it is only necessary that the connecting substrate 20 and a semiconductor element 10 are assembled, with solder bumps 24 of the connecting substrate 20 and electrodes or terminals 14 of the semiconductor element 10 being aligned with each other, and the solder bumps 24 are then reflowed to join the connecting substrate 20 to the semiconductor element 10. By use of the connecting substrate 20 provided with members (bumps 24 or the like) formed of solder to be connected to electrodes or terminals of a semiconductor element, the semiconductor element can be easily mounted on the connecting substrate to thereby easily produce a semiconductor device. Also, in the case where the semiconductor device is mounted on a mounting substrate or the like, the mounting can be achieved by only reflowing solder. In addition, the semiconductor device produced by connecting the connecting substrate to the semiconductor element by solder is excellent in handling properties compared with semiconductor devices made by flip chip bonding technique, and allows the device to be easily remounted.

The connecting substrate of the invention is very simply constructed, and the process for the manufacture thereof is not particularly complicated. Accordingly, the invention makes it easy to produce a connecting substrate corresponding to a product semiconductor device, and can shorten the time required to deliver the connecting substrate and lower its manufacturing cost. Additionally, the invention allows the production cost of a chip sized semiconductor device, produced by use of the connecting substrate of the invention, to be reduced.

Thus, according to the invention, a connecting substrate is provided, in which external connection terminals can be arranged at a higher density and which can be preferably used as an interposer to produce a device of chip sized package. The invention also provides a semiconductor device in which the connecting substrate described above is connected to a semiconductor element, whereby rerouting a semiconductor material to make a wiring pattern on an electrode/terminal-formed face of the semiconductor element becomes easy, and efficient arrangement of electrodes or terminals of a semiconductor element in the plane of the electrode/terminal-formed face thereof is made possible. The invention can further provide a semiconductor device as a device of chip sized package having a simpler construction, which is manufactured at a lower cost.

What is claimed is:

1. A semiconductor device having a semiconductor element and a connecting substrate, wherein the connecting substrate comprises a flat sheet-like insulation member having first and second surfaces, and vias piercing the insulation member from the first surface to the second surface in a thickness direction of the member, the first surface being provided with solder bumps at ends of the respective vias, the second surface being provided with external connection terminals at opposite ends of the respective vias, and each respective set of one of the vias, one of the solder bumps and one of the external connection terminals is aligned with each other, and is located at respective locations of electrodes on an electrode/terminal-formed face of the semiconductor element or terminals formed at ends of patterned wirings formed by rerouting a conductive material on the electrode/terminal-formed face, wherein the solder bump projects from the first surface, wherein said one of the external connection terminals has a larger diameter than said one of the solder bumps on the first surface and is electrically connected with said one of the solder bumps through said one of the vias, and wherein the semiconductor element is mounted on the connecting substrate by bonding the electrodes or the terminals on the electrode/terminal-formed face of the semiconductor element to the solder bumps.

2. The semiconductor device of claim 1, wherein an underfiller material is filled in a gap formed between the electrode/terminal-formed face of the semiconductor element and the first surface of the insulation member.

3. The semiconductor device of claim 1, wherein the insulation member is made of a material having Young's moduli of not greater than 500 MPa near room temperature and not greater than 50 MPa near 150° C.

4. The semiconductor device of claim 1, wherein the via is formed by filling a hole penetrating the insulation member with solder.

5. The semiconductor device of claim 1, wherein the via is formed by filling most of a hole penetrating the insulation member with copper material.

6. A connecting substrate used to produce a semiconductor device, which substrate comprises a flat sheet-like insulation member having first and second surfaces, and vias piercing the insulation member from the first surface to the second surface in a thickness direction of the member, the first surface being provided with solder bumps at ends of the respective vias, the second surface being provided with external connection terminals at opposite ends of the respective vias, and each respective set of one of the vias, one of the solder bumps and one of the external connection terminals is aligned with each other and is located at respective locations of electrodes on an electrode/terminal-formed face of the semiconductor element or terminals formed at ends of patterned wirings formed by rerouting a conductive material on the electrode/terminal-formed face, wherein the solder bump projects from the first surface, wherein said one of the external connection terminals has a larger diameter than said one of the solder bumps on the first surface and is electrically connected with said one of the solder bumps through said one of the via.

7. The connecting substrate of claim 6, wherein the insulation member is made of a material having Young's moduli of not greater than 500 MPa near room temperature and not greater than 50 MPa near 150° C.

8. The connecting substrate of claim 6, wherein the via is formed by filling a hole penetrating the insulation member with solder.

9. The connecting substrate of claim 6, wherein the via is formed by filling most of a hole penetrating the insulation member with copper material.

10. The semiconductor device of claim 1, wherein each of the solder bumps and a respective electrode or terminal are formed substantially concentrically on the respective surfaces of the insulation member.

11. The semiconductor device of claim 1, wherein the diameter of the solder bumps is approximately equivalent to a diameter of the electrode or terminal.

12. The semiconductor element of claim 1, wherein the insulation member is at least one of a heat-resistant rubber based on a silicone or fluorinated resin, an epoxy or other resin containing a dispersed low elasticity modulus material including nitrile-based rubbers, a polyolefin, a polyamide, a glass fiber-filled resin, bismaleimide thiazine and polyphenylene ether.

13. The semiconductor element of claim 6, wherein the insulation member is at least one of a heat-resistant rubber based on a silicone or fluorinated resin, an epoxy or other resin containing a dispersed low elasticity modulus material including nitrile-based rubbers, a polyolefin, a polyamide, a glass fiber-filled resin, bismaleimide thiazine and polyphenylene ether.

* * * * *